United States Patent [19]

Awal et al.

[11] Patent Number: 4,786,616
[45] Date of Patent: Nov. 22, 1988

[54] METHOD FOR HETEROEPITAXIAL GROWTH USING MULTIPLE MBE CHAMBERS

[75] Inventors: Muhammad A. Awal, Trenton; El Hang Lee, East Brunswick, both of N.J.

[73] Assignee: American Telephone and Telegraph Company, New York, N.Y.

[21] Appl. No.: 61,069

[22] Filed: Jun. 12, 1987

[51] Int. Cl.⁴ .................. H01L 21/306; H01L 21/205
[52] U.S. Cl. .......................... 437/105; 148/DIG. 21; 148/DIG. 169; 118/50.1; 156/610; 437/107; 437/132; 437/949
[58] Field of Search ...................... 118/50.1, 719, 726; 148/DIG. 25, 72, 169; 156/610-614; 437/107, 126, 133, 173, 908, 105, 132; 357/16; 427/38, 39

[56] References Cited

U.S. PATENT DOCUMENTS

| | | | |
|---|---|---|---|
| 4,047,624 | 9/1977 | Dorenbos | 214/17 B |
| 4,159,919 | 7/1979 | McFee et al. | 437/105 |
| 4,171,235 | 10/1979 | Fraas et al. | 437/106 |
| 4,430,149 | 2/1984 | Berkman | 118/719 |
| 4,477,311 | 10/1984 | Mimura et al. | 437/105 |
| 4,492,716 | 1/1985 | Yamazaki | 427/38 |
| 4,498,416 | 2/1985 | Bouchaib | 118/719 |
| 4,505,950 | 3/1985 | Yamazaki | 118/719 |
| 4,543,267 | 9/1985 | Yamazaki | 437/105 |
| 4,554,030 | 11/1985 | Haisma et al. | 437/105 |
| 4,592,306 | 6/1986 | Gallego | 118/726 |
| 4,615,298 | 10/1986 | Yamazaki | 118/723 |
| 4,632,712 | 12/1986 | Fan et al. | 437/132 |
| 4,645,683 | 2/1987 | Gourrier et al. | 427/38 |
| 4,664,062 | 5/1987 | Kamohara et al. | 118/719 |
| 4,666,734 | 5/1987 | Kamiya et al. | 427/39 |
| 4,676,884 | 6/1987 | Dimock et al. | 118/719 |
| 4,681,773 | 7/1987 | Bean | 427/38 |
| 4,693,777 | 9/1987 | Hazano et al. | 118/50.1 |

OTHER PUBLICATIONS

Parker, The Technology and Physics of Molecular Beam Epitaxy, Plenum Press, New York, NY, 1985, pp.655-657, 667-669.

DiGiuseppe et al., "Quantum Well Structures ... Vapor Phase Epitaxy in a Multiple Chamber Reactor", Appl. Phys. Lett., 43(10), 15 Nov. 1983, pp. 906-908.

*Primary Examiner*—Brian E. Hearn
*Assistant Examiner*—William Bunch
*Attorney, Agent, or Firm*—Roderick B. Anderson

[57] ABSTRACT

A method for epitaxially growing a layer of III–V material on a wafer of a material such as silicon comprises the steps of placing the wafer (16') in a first ultra-high vacuum chamber (11), and epitaxially growing a transition layer such as germanium on the wafer. An intermediate high vacuum chamber (13) is used to transport the wafer 16' to a second ultra-high vacuum chamber (12), and the second chamber (12) is used to epitaxially grow a layer of III–V material over the transition layer. Gate valves (33 and 15) are sequentially opened and closed to that the second vacuum chamber (12) cannot be contaminated by gases or particles from the first vacuum chamber (11). Wafer transport from chamber (11) to (13) is achieved without exposure to the atmosphere or to significant pressure changes thus avoiding the waste of transfer time or the formation of native oxide on the wafer surface.

13 Claims, 2 Drawing Sheets

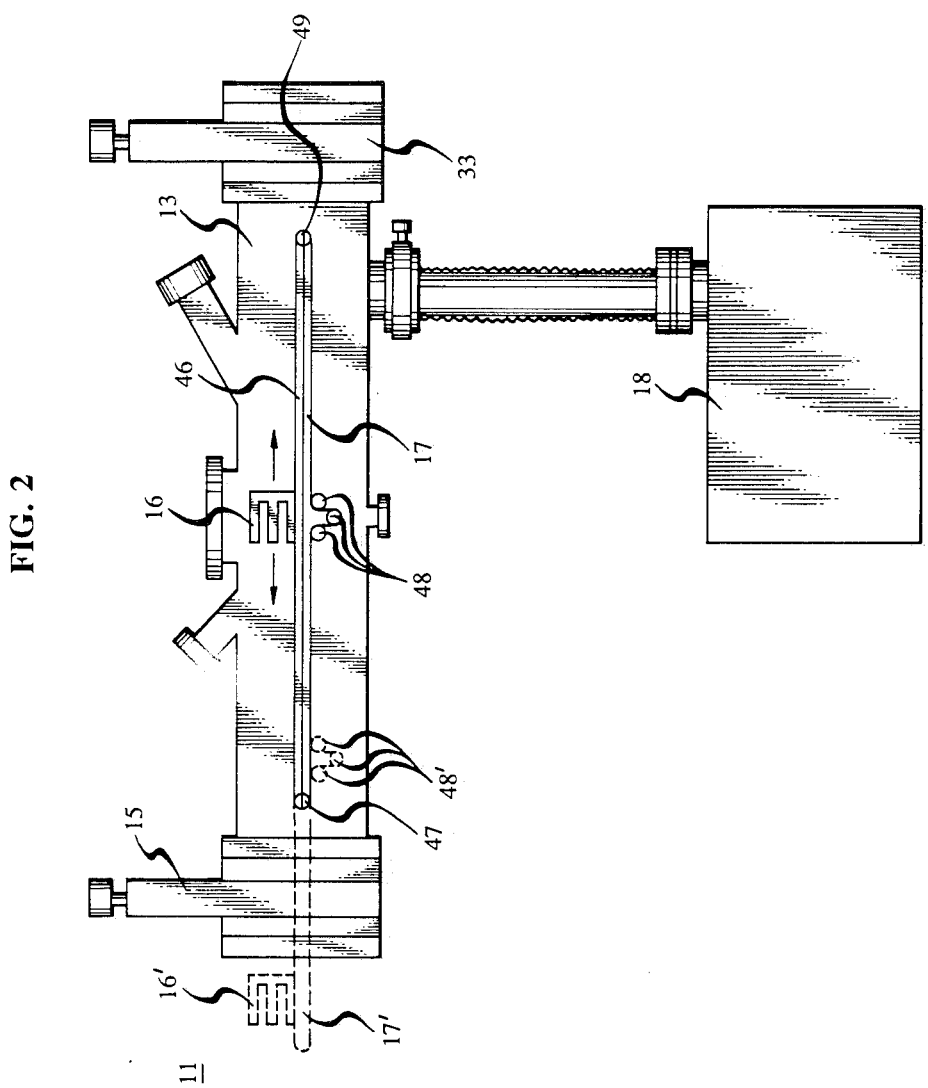

METHOD FOR HETEROEPITAXIAL GROWTH USING MULTIPLE MBE CHAMBERS

TECHNICAL FIELD

This invention relates to methods and apparatus for making semiconductor devices of two or more semiconductor materials, and more particularly, to methods and apparatus for making III-V epitaxial layers on silicon or germanium substrates.

BACKGROUND OF THE INVENTION

Most integrated circuits are today made of silicon, a material which is well understood and offers many fabrication advantages. It is recognized, however, that certain semiconductor compounds composed of elements from groups III and V of the periodic table, known as III-V materials, offer significant advantages over silicon. III-V materials such as gallium arsenide have a higher electron mobility than does silicon and devices made from it are therefore capable of operating at a higher speed. Band-gap characteristics of III-V materials typically make them more suitable for optoelectronic or photonic applications; for example, they can be efficient light emitters and light detectors at wavelengths for which silicon would be unsuitable.

One problem in the fabrication of III-V devices is the difficulty of growing large single-crystal ingots with a sufficiently low defect density; thus, it is impractical to make wafer substrates of III-V material with as large a diameter as that of silicon wafers. It has therefore been suggested that large-area III-V wafers, from which III-V devices are to be made, can be made by epitaxially growing III-V material on a planar surface of a relatively large-diameter single-crystal silicon wafer. Epitaxial growth refers to a method of depositing a material on a substrate such that the crystal structure of the deposited material effectively constitutes an extension of the crystal structure of the substrate. Vapor of the material is normally exposed to the substrate in a vacuum chamber that has been evacuated to an ultra-high vacuum condition, which may be defined as a condition in which the pressure is less than about $10^{-9}$ torr and typically about $10^{-10}$ torr. Under this and other appropriate conditions, successive monolayers of the material are deposited essentially as a single crystal on the substrate. Other advantages of growing III-V material on silicon result from improved ruggedness and thermal conduction properties of the resulting III-V devices. Moreover, such construction would make possible the integration of III-V devices with silicon devices.

One way matching the lattice structure of the deposited material to the substrate, as required for epitaxial growth, is by including an intermediate or transition epitaxial layer of a material such as germanium or calcium fluoride between the silicon substrate and the III-V epitaxial layer. The transition layer also alleviates the problem of thermal mismatch of the III-V material with respect to the substrate. It is normally important that the epitaxial growth of the transition layer and a III-V layer be done sequentially, and that steps are taken to avoid contamination of one material by the other. Thus, after an epitaxial layer of, say, germanium is grown over the silicon substrate, it is important that the ultra-high vacuum chamber be thoroughly exhausted of germanium gases before the step of epitaxially growing the III-V material, such as gallium arsenide. One problem with this method is that, without a high degree of care, which may be time-consuming, spurious germanium gases or particles may remain in the vacuum chamber during the gallium arsenide growth process which are likely to contaminate the gallium arsenide epitaxial layer. Another problem is that removal of the wafer into the outside atmosphere subjects it to a further risk of contamination and is also somewhat time-consuming. Any unwanted contamination of the III-V material that constitutes an active portion of a finished III-V device can severely degrade the operation of the device.

SUMMARY OF THE INVENTION

The foregoing problems of growing a III-V layer over a transition layer can be solved by a method which utilizes three vacuum chambers for isolating the growth of the III-V layer from the growth of the transition layer. The transition layer is epitaxially grown in a first vacuum chamber and then the vapors and particulates of the transition material are evacuated from the first vacuum chamber. An intermediate vacuum chamber contiguous to the first chamber is evacuated to a high vacuum condition and brought into communication with the first vacuum chamber so that together they constitute a combined single high vacuum chamber and the substrate is transported to the intermediate vacuum chamber. The first vacuum chamber is then sealed from the intermediate vacuum chamber such as to maintain an ultra-high vacuum (UHV-sealed). Next, a second vacuum chamber contiguous to the intermediate vacuum chamber is evacuated to a high vacuum condition. The second and the intermediate vacuum chambers are brought into mutual communication so that together they constitute a single high vacuum chamber and the substrate is transported to the second vacuum chamber. The second vacuum chamber is then UHV-sealed from the intermediate vacuum chamber, and thereafter the III-V layer is epitaxially grown over the transition layer.

As will be appreciated, this method expediently and dependably isolates the epitaxial growth of the III-V material from any exposure to vapors or particles of the transition material. The arrangement of vacuum chambers that can be selectively interconnected or UHV-sealed permits the wafer substrate to be transported without subjecting it to any significant pressure changes. This in turn greatly reduces the transfer time and the chances for contamination as compared with, for example, methods in which, during an intermediate step, the wafer might be transported to an atmospheric pressure environment.

BRIEF DESCRIPTION OF THE DRAWING

FIG. 2 is the schematic view of a intermediate vacuum chamber of the apparatus of FIG. 1.

DETAILED DESCRIPTION

Figure 1:
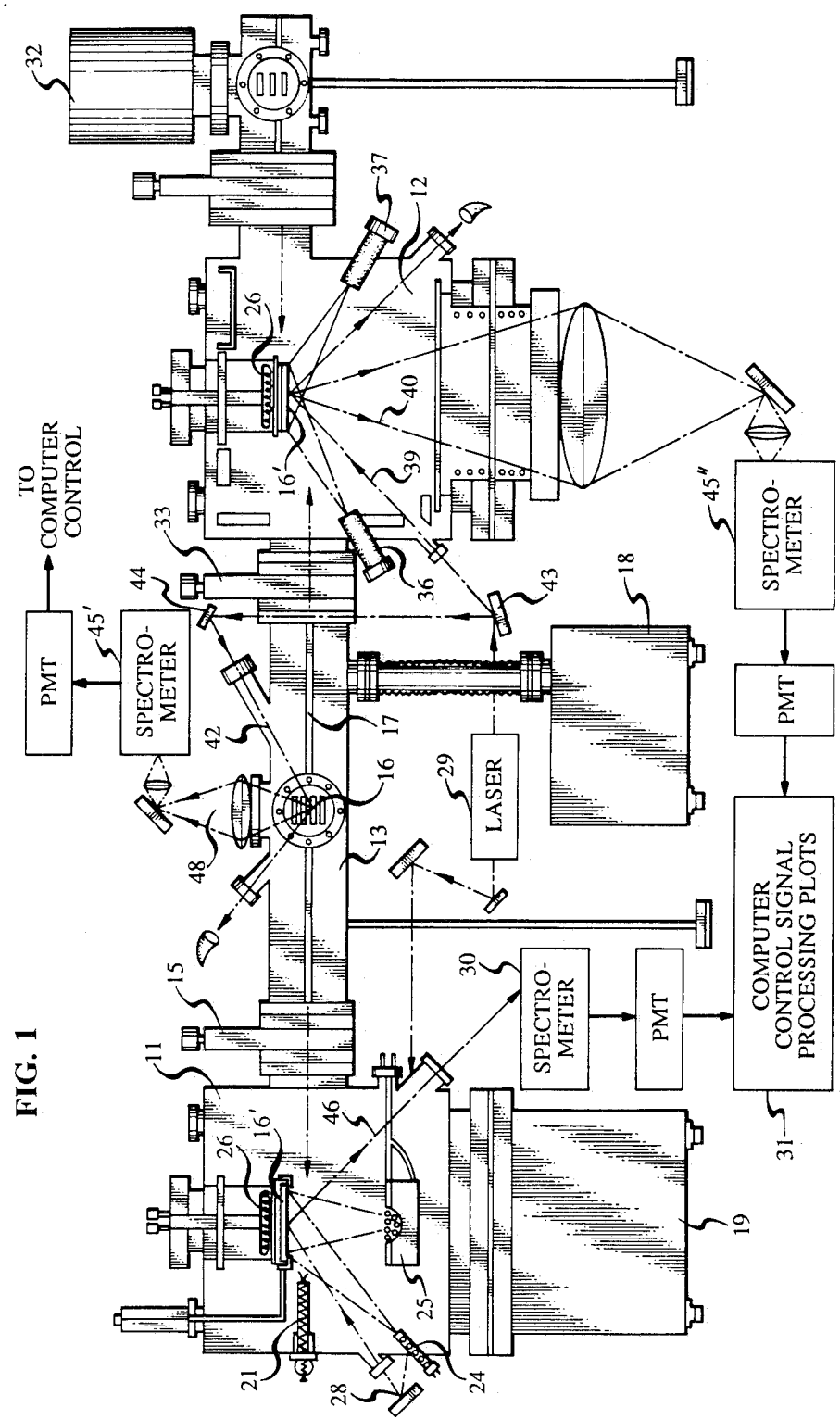
FIG. 1 is a schematic view of epitaxial growth apparatus used in one illustrative embodiment of the invention.

Referring now to FIG. 1, the major components of apparatus for epitaxially growing III-V material on a silicon substrate in accordance with an illustrative embodiment of the invention are a first ultra-high vacuum chamber 11, a second ultra-high vacuum chamber 12 and an intermediate vacuum chamber 13 interconnecting the first and second vacuum chambers. The first vacuum chamber 11 is used for growing a transition layer such as germanium on a substrate wafer such as silicon. The second vacuum chamber 12 is then used for epitaxially growing a layer of III–V material such as gallium arsenide over the layer of transition material. These two vacuum chambers are isolated from each other so as to avoid contamination of the layer of III–V material by material of the transition layer. As will become clear later, the intermediate vacuum chamber 13 permits wafers to be transported quickly and conveniently between the vacuum chambers without subjecting them to contamination or to any significant pressure changes.

An illustrative method in accordance with the invention is commenced with the intermediate vacuum chamber 13 at atmospheric pressure and UHV-sealed by means of a gate valve 15 from the first vacuum chamber 11. A plurality of wafer substrates 16 are loaded onto a movable conveyor 17 in the intermediate vacuum chamber. After loading, the intermediate vacuum chamber 13 is evacuated by a pump 18 to a high vacuum condition which may be defined as a pressure of less than $10^{-7}$ torr and preferably about $10^{-9}$ torr. Preferably, before the evacuation of intermediate chamber 13, first chamber 11 has been similarly evacuated to a high vacuum condition by means of an ultra-high vacuum pump 19. This pumping operation is effective, in a known manner, to evacuate most contaminants from the first vacuum chamber.

After vacuum chambers 13 and 11 have both been evacuated to a substantially common high vacuum, gate valve 15 is opened so that the two vacuum chambers communicate and essentially constitute a single vacuum chamber. Next, the wafers 16 are transported by the conveyor 17 to the first vacuum chamber 11. A wobble stick 21 is used to remove one of the wafers from the rack and place it in a holder within the first vacuum chamber 11 in the position shown by wafer 16′ in the drawing. The wobble stick is spring loaded so that it can extend across the vacuum chamber, is pivoted, and is manipulated manually from outside the vacuum chamber so as to be capable of grasping a selected wafer. Thereafter, the conveyor 17 and the remaining silicon wafers 16 are withdrawn back into the intermediate vacuum chamber 13 and the gate valve 15 is again closed and UHV-sealed. Vacuum chamber 11 is then pumped down to an ultra-high vacuum condition, which may be defined as being less than $10^{-9}$ torr; for germanium growth, it is preferably about $10^{-10}$ torr or less.

Next, a transition layer, such as germanium, is epitaxially grown on the wafer 16′ by exposing it to germanium vapor evaporated from source 24 or 25. A heater 26 in conjunction with a heating coil controls the temperature of the silicon substrate wafer. As is known, substrate temperature, vapor pressure and other conditions within the chamber must be carefully controlled so that successive monolayers of germanium are deposited on the silicon wafer in such a way as to constitute an extension of the crystal lattice of the wafer 16′.

The thickness and constituency of the germanium epitaxial layer are monitored by directing a laser beam 28 from a laser 29 onto the growing epitaxial layer and collecting and analyzing light 46 which is scattered from the surface. Scattered light is directed through a transparent vacuum-tight window and lens to a spectrometer 30, the output of which is directed to a a computer 31. The computer may be used to provide a feedback signal to control the growth process. As is known, Raman, photoluminsence and reflectance spectroscopy can be used to monitor substrate temperature, substrate surface conditions, and initial nucleation, in addition to thickness and constituency of the epitaxial layer. Because the light is directed through transparent ports in the vacuum chamber, this in-situ monitoring can be made by external apparatus without interfering with the epitaxial growth process in the ultra-high vacuum chamber, which permits instant modifications in the growth process to achieve a high quality epitaxial layer.

After growth is complete, sources 24 and 25 are turned off and closed with shutters, all germanium vapors and particles are evacuated from first vacuum chamber 11, and the gate valve 15 is thereafter opened so that chambers 11 and 13 together constitute a single vacuum chamber. Conveyor 17 communicates with first vacuum chamber 11 so that the wobble stick 21 can be used to replace wafer 16′ on the rack with the other silicon wafer 16. Wafer 16′ is withdrawn into the intermediate vacuum chamber 13 with minimal risk of contamination to the intermediate chamber (since it is maintained at $10^{-7}$–$10^{-9}$ torr) and the gate valve 15 is again closed and UHV-sealed.

To determine further the epitaxial quality of the germanium, optical tests are performed in the intermediate chamber 13. Wafer 16′ is positioned at the center of chamber 13. Laser beam 42 from a laser source 29 is directed to the intermediate chamber via mirrors 43 and 44, and the scattered light 48 is analyzed by the spectrometer 45′ and computer 31 as before.

Next, the vacuum chamber 12 is evacuated to a high vacuum condition by means of a pump 32. A gate valve 33 is then opened so that second vacuum chamber 12 and intermediate vacuum chamber 13 essentially constitute a common vacuum chamber. The conveyor 17 transports the wafers 16 including wafer 16′ through the gate valve 33 to the second vacuum chamber 12 where a wobble stick similar to 21 is used to remove wafer 16′ and place it in a holder in the position shown within vacuum chamber 12. The gate valve 33 is then closed and UHV-sealed to isolate chamber 12 from the rest of the apparatus and the pressure is further reduced to an ultra-high vacuum condition, preferably $10^{-11}$ torr, by pump 32. Using heater 26, the silicon substrate coated with the germanium layer is heated to the growth temperature of gallium arsenide.

Gallium and arsenic vapors, originating from sources 36 and 37, respectively, are deposited and gallium arsenide is epitaxially grown over the germanium coated silicon wafer 16′. As before, the substrate temperature, pressure and vapor flux rate are carefully controlled and the growth is monitored by means of a laser beam 39 yielding scattered light 40 which may be appropriately analyzed by spectrometer 45″ and computer 31, using Raman, photoreflectance and photoluminescence spectroscopy.

After growth of the gallium arsenide layer, gases and particles are evacuated from the vacuum chamber 12. The gate valve 33 is then opened and conveyor 17 transports the completed wafer 16′ back into the intermediate vacuum chamber 13. Then the valve 33 is UHV-sealed, chamber 13 is brought to atmospheric pressure, and the wafer 16′ is removed from the apparatus. Thereafter, successive wafers 16 are processed in the same manner as has been described. Alternatively, all of the wafers 16 may be processed before any of them are removed outside from intermediate vacuum chamber 13.

In an embodiment that has been made and used by applicants, optical ports were included in the intermediate vacuum chamber to allow the laser beam 42 originating from laser 29 to be directed at the surface of the wafer 16'. This has been found to be useful for making a final assessment of the structural and electronic quality of both the germanium transition layer after processing in the first vacuum chamber 11, and for analyzing the final gallium arsenide layer after it has been deposited in the second vacuum chamber 12. The manner in which scattered laser light can be used to analyze epitaxial layers and to monitor epitaxial growth in real time are described for example, in the publications "In-Situ Surface Analysis of GaAlAs/GaAs in MOCVD System by Ellipsometry." C. B. Theeten, F. Hottier, J. Hallais, *Journal of Crystal Growth*, vol. 46, pg. 245 (1979), and "Proc. Int. Mtg. Photophysics and Photochemistry," Bombanner, France, Sept. 17-21, 1984, edited by F. Lahmani.

The method by which wafers 16 are transported by conveyor 17 is illustrated in more detail in FIG. 2. The wafers 16 are mounted on a rack which is connected to a flexible endless belt 46. The flexible belt 46 in turn is threaded around pulleys 47, 48 and 49. The entire conveyor 17 is laterally movable between one position in which one end may extend into the first vacuum chamber 11 and another position in which the other extreme end may extend into vacuum chamber 12. Thus, when it is desired to move a wafer to the first vacuum chamber 11, for example, the conveyor 17 is laterally moved in its entirety to the position shown in phantom as 17'. The flexible belt 46 is also moved in a counter-clockwise direction so as to transport the wafers 16 to the position shown as 16'. This permits the wafers to extend within vacuum chamber 11 of FIG. 1 and permits the wobble stick 21 to grasp a desired wafer and place it in a wafer holder. Thereafter, conveyor 17 is withdrawn to the position as shown in solid lines so that gate valve 15 can be again UHV-sealed as described before. In the same manner, the wafers can selectively be transported so as to extend within vacuum chamber 12 to permit a similar wafer removal within that chamber.

While the drawings are schematic and the specification has been simplified to allow an appreciation of the advantages of the invention, it is to be understood that implementation of all aspects of the specification are well within the skill of a worker in the art. The construction of ultra-high vacuum chambers and the use of ultra-high vacuum pumps are described, for example, in the publication "Physical Principles of UHV Systems and Equipment," N. W. Robinson, Chapman and Hall, (1968), and "Scientific Foundation of Vacuum Technology," S. Dushman, J. Wiley & Sons, (1962). The gate valves 15 and 33 are constructed in a known manner so as to give a dependable air-tight seal with atmospheric pressure on one side and $10^{-10}$ torr pressure on the opposite side. Ultra-high vacuums of less than $10^{-9}$ torr are virtually always required for good quality epitaxial growth, while high vacuums of less than $10^{-7}$ torr are required for the intermediate chamber 13 to avoid substantial pressure changes and formation of native oxide on the wafer surface from atmospheric oxygen which would deleteriously affect the epitaxial quality of the layers.

It can be appreciated that with the method and apparatus that has been described, a germanium transition layer can be grown on a silicon wafer and a gallium arsenide layer can then quickly and expediently be grown over the transition layer in such a manner that, during the entire operation, the wafer is not exposed to contamination from the atmosphere or to significant pressure changes and yet the gallium arsenide growth is completely isolated from the germanium growth so that the risk of contamination of the gallium arsenide layer is significantly reduced.

As is known in the art, it may be advantageous to grow a second epitaxial transition layer of an alkali halide material such as calcium fluoride over the germanium transition layer. This can normally be done in successive operations in vacuum chamber 11 since both transition layers are non-interactive to each other and contamination of the calcium fluoride, for example, by the germanium does not normally pose a problem. Alternatively, a germanium wafer can be used rather than a silicon wafer and the transition layer may be calcium fluoride, epitaxial germanium, or an epitaxial layer of calcium fluoride or other alkali halide over an epitaxial layer of germanium. Germanium-silicide superlattice and calcium strontium fluoride may also be used as transition layers which may allow a more exact lattice match to gallium arsenide. Numerous other modifications and embodiments may be made by those skilled in the art without departing from the spirit and scope of the invention.

We claim:

1. A method for making semiconductor devices comprising the steps of, epitaxially growing, in an ultra-high vacuum and on a crystalline substrate, a first layer of a first material, and then epitaxially growing, in an ultra-high vacuum and over the first layer, a second layer of a second material that is different from the first material, characterized in that
    the first layer is epitaxially grown in a first vacuum chamber that has been separately evacuated to a high vacuum condition;
    vapors and particulates of the first layer material are evacuated from the first vacuum chamber;
    an intermediate vacuum chamber is separately evacuated to a high vacuum condition;
    the first and intermediate vacuum chambers are thereafter brought into mutual communication so that together they constitute a combined single high vacuum chamber and the substrate is transported to the intermediate vacuum chamber;
    the first vacuum chamber is next UHV-sealed from the intermediate vacuum chamber;
    a second vacuum chamber is separately evacuated to a high vacuum condition;
    the intermediate and second vacuum chambers are thereafter brought into mutual communication so that together they constitute a single high vacuum chamber and the substrate is transported to the second vacuum chamber;
    the intermediate vacuum chamber is next UHV-sealed from the second vacuum chamber; and
    the second layer is next epitaxially grown over the first layer.

2. The method of claim 1,
    further characterized in that
    the step of evacuating each vacuum chamber is accomplished by a separate vacuum pump connected to such vacuum chamber which evacuates such vacuum chamber to a pressure of less than $10^{-7}$ torr.

3. The method of claim 2,
further characterized in that
the substrate is of a material selected from the group consisting of silicon and germanium;
the first material is a material selected from the group consisting of group IV materials and alkali halide materials; and
the second material is a III–V material.

4. The method of claim 3,
further characterized in that
the growth and quality of the first layer is monitored in-situ by directing a first laser beam into the first vacuum chamber onto a surface of the first layer and retrieving from the first chamber laser light scattered from said surface.

5. The method of claim 4,
further characterized in that
the structural and electronic quality of the first layer is further examined by directing a second laser beam into the intermediate chamber onto the surface of the transition layer and retrieving from the intermediate chamber laser light scattered from the said surface.

6. The method of claim 5,
further characterized in that
the growth of the second layer is monitored by directing a third laser beam into the second vacuum chamber onto the upper surface of the second layer and retrieving from the second vacuum chamber laser light scattered from the upper surface of the second layer.

7. The method of claim 1,
further characterized in that
the substrate is first loaded into the intermediate vacuum chamber while intermediate vacuum chamber is at substantially atmospheric pressure;
the intermediate vacuum chamber is then evacuated to a high vacuum condition; and
the first and intermediate chambers are next brought into mutual communication so that together they constitute a combined single high vacuum chamber, the substrate is transported to the first chamber, the intermediate chamber is UHV-sealed from the first chamber, the first chamber is further pumped to an ultra-high vacuum condition, and thereafter the first layer is epitaxially grown on the substrate.

8. The method of claim 7,
further characterized in that
after the second layer has been epitaxially grown, the intermediate and second vacuum chambers are brought into mutual communication so that together they constitute a single high vacuum chamber and the substrate is transported to the intermediate vacuum chamber;
the second vacuum chamber is next UHV-sealed from the intermediate vacuum chamber;
the intermediate vacuum chamber is returned to a pressure near atmospheric pressure; and
the substrate is unloaded from the intermediate vacuum chamber.

9. The method of claim 3,
further characterized in that
the substrate is crystalline silicon.

10. The method of claim 9,
further characterized in that
the first material is germanium.

11. The method of claim 10,
further characterized in that
the second material is gallium arsenide.

12. The method of claim 11,
further characterized in that
a third layer of calcium fluoride is epitaxially grown in the first chamber over the first layer of germanium; and
the second layer of gallium arsenide is epitaxially grown in the second chamber over the third layer.

13. The method of claim 9,
further characterized in that
the first material is calcium fluoride.

* * * * *